United States Patent
Yu

(10) Patent No.: US 6,489,829 B1
(45) Date of Patent: Dec. 3, 2002

(54) MULTIPLE-STAGE CONTROL CIRCUIT TO CONTROL RUSH CURRENT IN A MOSFET LOAD SWITCH

(75) Inventor: Tim Wen Hui Yu, Sunnyvale, CA (US)

(73) Assignee: Advanced Analogic Technologies, Inc., Sunnyvale, CA (US)

(*) Notice: Subject to any disclaimer, the term of this patent is extended or adjusted under 35 U.S.C. 154(b) by 0 days.

(21) Appl. No.: 09/834,582

(22) Filed: Apr. 12, 2001

(51) Int. Cl.[7] .................... H03K 17/16; H03K 17/30
(52) U.S. Cl. .................... 327/379; 327/112; 327/318
(58) Field of Search ..................... 327/112, 170, 327/379, 380, 381, 384, 387, 318

(56) References Cited

U.S. PATENT DOCUMENTS

| | | | | |
|---|---|---|---|---|
| 5,635,804 A | * | 6/1997 | Tanaka et al. | 318/139 |
| 6,069,509 A | * | 5/2000 | Labram | 134/112 |
| 6,118,324 A | * | 9/2000 | Li et al. | 326/26 |

OTHER PUBLICATIONS

Vishay Siliconix, Si3861, "Load Switch with Level–Shift" Document No. 70861, S–60513–Rev. A, Apr. 5, 1999,(pp. 2–1–2.5).

* cited by examiner

Primary Examiner—Terry D. Cunningham
Assistant Examiner—Quan Tra
(74) Attorney, Agent, or Firm—Silicon Valley Patent Group LLP; David E. Steuber

(57) ABSTRACT

Circuits and methods to turn-on a power MOSFET switch while limiting rush current delivered to a load are disclosed. In an exemplary embodiment, a sense circuit senses when the power MOSFET is enhanced by a first level and a second level. A control circuit controls application of three drive forces to the gate of the power MOSFET in response to the sense circuit. The first drive force adjusts the voltage applied to the gate at a first rate. The second drive force adjusts the voltage applied to the gate at a second rate less than the first rate. The third drive force adjusts the voltage applied to the gate at a third rate greater than the second rate. The circuit utilizes most of the allotted turn-on time to linearly control the power MOSFET enhancement, providing optimal slew rate control and limiting the rush current delivered to the load.

47 Claims, 7 Drawing Sheets

MULTIPLE-STAGE CONTROL CIRCUIT TO CONTROL RUSH CURRENT IN A MOSFET LOAD SWITCH

BACKGROUND

Many applications deliver power to electrical systems, or loads, through power MOSFET switches. Often, a single power source drives several loads, each with its own power MOSFET switch. If one power MOSFET is switched on quickly, the change in voltage combined with the typically low on-resistance of the power MOSFET can cause a large current surge, called a "rush current," to flow through the power MOSFET to the load. The rush current can cause voltage fluctuations and possibly trigger malfunction of the load circuits. In particular, fluctuations in the power source voltage can cause other load circuits to turn off in response to under-voltage lock-out protection schemes. Thus, minimizing the rush current is important for reliable operation of the load circuits.

Most prior art designs focus on incorporating protection circuits in the loads to handle the rush current generated during switching. It is more efficient and more desirable, however, to reduce the generated rush current and prevent a high current from reaching the loads at all. One way to minimize the rush current, is to gradually increase the power delivery capability of the power MOSFET switch over a finite turn-on time.

FIG. 1a is a circuit diagram of a prior art circuit 100 to control power MOSFET rush current. A p-type power MOSFET 105 has a drain labeled VOUT, a source labeled VIN, a gate 130, and a body. As is common in power MOSFETs, the source and body are shorted together to prevent the parasitic bipolar junction transistor inherent in power MOSFET 105 from turning on. A first resistor 115 is coupled between gate 130 and the source of power MOSFET 105. A capacitor 125 is coupled between gate 130 and the drain of power MOSFET 105. The drain of an n-type control MOSFET 110 is coupled to gate 130 of power MOSFET 105. A control signal is applied to a gate, labeled ON/OFF, of control MOSFET 110. A second resistor 120 is coupled between the source of control MOSFET 110 and ground, labeled GND. In circuit 100, a power source (not shown) is applied at VIN, and a load (not shown) is driven by VOUT.

When the control signal is ON, a "high" voltage, for example 5V, is applied to the gate of control MOSFET 110, thereby turning control MOSFET 110 on and allowing it to conduct current. When the control signal is OFF, a "low" voltage, for example 0V, is applied to the gate of control MOSFET 110, thereby turning control MOSFET 110 off and prohibiting it from conducting current.

In the off state of power MOSFET 105, the control signal applied at the gate of control MOSFET 110 is low (OFF), and control MOSFET 110 is off. Since no current flows through control MOSFET 110, the voltage at gate 130 of power MOSFET 105 is equal to VIN, the power source voltage, which may be, for example, 5V. The voltage across capacitor 125 is |VIN−VOUT|.

When the control signal at the gate of control MOSFET 110 is turned ON (high), control MOSFET 110 turns on and begins to conduct current. Current flows along the path from VIN through resistor 115, through control MOSFET 110, and through resistor 120 to GND. The voltage on gate 130 of power MOSFET 105 begins to decrease slowly since it is limited by charging of capacitor 125.

FIG. 1b is a gate voltage vs. time plot for power MOSFET 105 of prior art circuit 100 of FIG. 1a. The plot shows a gate voltage curve 150 at gate 130 of power MOSFET 105 during a finite turn-on time, for example, 1.6 ms. At t=0 ms, the voltage at gate 130 is VIN, i.e. 5V. As shown in the plot, the voltage at gate 130 of power MOSFET 105 decreases slowly in an initial stage 152.

Power MOSFET 105 begins to turn on when the gate 130 to source (VIN) voltage drops below the threshold voltage of power MOSFET 105. For example, if the threshold voltage of power MOSFET 105 is $V_T=-1V$, power MOSFET 105 begins to turn when the voltage at gate 130 reaches 4V for VIN=5V which is shortly before t=0.2 ms in FIG. 1b. Initial stage 152 of the voltage decrease at gate 130 is a "dead time" in the finite turn-on time since power MOSFET 105 is not conducting.

The voltage on gate 130 of power MOSFET 105 continues to decrease through a middle stage 154 as shown in FIG. 1b. During this time, the on-resistance of power MOSFET 105 decreases nonlinearly. When the gate 130 to source (VIN) voltage reaches twice the threshold voltage of power MOSFET 105, power MOSFET 105 is essentially fully on. This occurs, for example, when the voltage at gate 130 reaches 3V, for VIN=5V and $V_T=-1V$, which is near t=0.6 ms in FIG. 1b.

After this point, the voltage at gate 130 decreases through a final stage 156, as shown in FIG. 1b, until the maximum drive on power MOSFET 105 is reached when the voltage at gate 130 is approximately 0V at the end of the finite turn-on time at t=1.6 ms. This is accomplished by having the resistance of resistor 115 be much larger than the resistance of resistor 120. The time to reach maximum drive is approximately t=1 ms in this example. During this time, the on resistance of power MOSFET 105 changes very little and is non-linear. Thus, the load driven by VOUT is supplied with the power source voltage VIN.

FIG. 1c is a current vs. time plot showing the current through power MOSFET 105 of prior art circuit 100 of FIG. 1a. A current curve 180 has two notable features. A rush current 182 flows which is much higher than the level of a final current 186. Rush current 182 supplies the initial current to charge capacitor 125.

When the control signal at the gate of control MOSFET 110 is turned OFF (low), control MOSFET 110 stops conducting current. The voltage at gate 130 of power MOSFET 105 discharges through resistor 115 and capacitor 125.

The goal of prior art circuit 100 is to apply a constant force to gate 130 of power MOSFET 105 in order to control the rush current. Prior art circuit 100, however, has several disadvantages. First, circuit 100 has a fairly large dead time before power MOSFET 105 turns on and begins conducting. Second, circuit 100 requires a fairly large time to reach maximum drive (i.e. when the voltage on gate 130 reaches 0V) after power MOSFET 105 turns on. Third, when control MOSFET 110 is turned on, circuit 100 conducts a large quiescent current thus dissipating high power. Fourth, when control MOSFET 110 is turned off, circuit 100 requires a long time before the voltage at gate 130 rises again to VIN.

The slow rates of change of the voltage on gate 130 to one threshold and then to maximum drive are undesirable, since they do not provide optimal rush current control. Prior art circuits using this constant driving force technique must compromise between turn-on time and driving force, resulting in non-optimal rush current control.

Thus, there is a clear need for a circuit that can optimize the drive force applied to the gate of a power MOSFET switch to minimize rush current delivered to a load through the power MOSFET.

SUMMARY

The present invention describes circuits and methods to limit rush current delivered from a power source to a load though a power MOSFET switch. The power MOSFET may be either a p-type power MOSFET or an n-type power MOSFET. In an exemplary circuit arrangement, the power source has a power terminal and a ground terminal. A first terminal of the power MOSFET is coupled to one of the power source terminals. The load is coupled to a second terminal of the power MOSFET.

The circuit arrangement also includes a control circuit including at least three inputs, the first of which is an enable signal, and at least three outputs. The control circuit is adapted to control the drive force applied to the power MOSFET gate, based on the inputs to the control circuit, to control the turn-on of the power MOSFET and to limit the rush current through the power MOSFET.

The circuit arrangement also includes a sense circuit with at least an input coupled to the gate of the power MOSFET, a first output coupled to the second input of the control circuit, and a second output coupled to the third input of the control circuit. The sense circuit is adapted to sense when the power MOSFET has been enhanced by a first level and by a second level.

The circuit arrangement also includes an off circuit with an input coupled to the third output of the control circuit and an output coupled to the gate of the power MOSFET. The off circuit is adapted to turn the power MOSFET off when necessary.

The circuit arrangement also includes a first drive circuit with an input coupled to the first output of the control circuit and an output coupled to the gate of the power MOSFET. The first drive circuit is adapted to adjust the voltage applied to the gate of the power MOSFET at a first rate.

The circuit arrangement also includes a second drive circuit with an output coupled to the gate of the power MOSFET. The second drive circuit is adapted to adjust the voltage applied to the gate of the power MOSFET at a second rate that is less than the first rate.

The circuit arrangement also includes a third drive circuit with an input coupled to the second output of the control circuit and an output coupled to the gate of the power MOSFET. The third drive circuit is adapted to adjust the voltage applied to the gate of the power MOSFET to a maximum level allowable by the power source at a third rate that is greater than the second rate.

In an exemplary method to control the rush current in a power MOSFET switch, the power MOSFET, including a gate terminal, is provided to act as a switch between a power source and a load. In the off-state of an enable signal, the power MOSFET is turned off so that the load is isolated. In the on-state of the enable signal, the enhancement of the power MOSFET is sensed to control the application of three drive forces to the gate terminal of the power MOSFET to turn the power MOSFET on in a finite turn-on time.

A first drive force is applied to the gate terminal of the power MOSFET. The first drive force is adapted to adjust the voltage applied to the gate terminal of the power MOSFET at a first rate until the power MOSFET has been enhanced by a first level. A second drive force is applied to the gate terminal of the power MOSFET. The second drive force is adapted to adjust the voltage applied to the gate terminal of the power MOSFET at a second rate that is less than the first rate, until the power MOSFET has been enhanced by a second level. The second drive force is further adapted to limit the rush current delivered to the load through the power MOSFET. A third drive force is applied to the gate terminal of the power MOSFET. The third drive force is adapted to adjust the voltage applied to the gate terminal of the power MOSFET at a third rate that is greater than the second rate so that the power MOSFET is enhanced by the maximum allowed by the power source.

Thus, the present invention describes circuits and methods to sense the enhancement of the power MOSFET switch and allow application of different drive forces to the power MOSFET gate during different stages of turn-on. Compared to prior art solutions, the turn-on scheme of the present invention best satisfies the requirements of the slew rate control and minimizes the rush current delivered from the power source through the power MOSFET to the load during turn-on.

BRIEF DESCRIPTION OF THE DRAWINGS

This invention will be better understood by reference to the following description and drawings, in which:

FIG. 1b is a gate voltage vs. time plot for the power MOSFET of the prior art circuit of FIG. 1a.

FIG. 1c is a current vs. time plot for the power MOSFET of the prior art circuit of FIG. 1a.

FIG. 2b. is a gate voltage vs. time plot for the power MOSFET of the circuit of FIG. 2a.

FIG. 3a is a gate voltage vs. time plot comparing the gate voltages of the power MOSFETs from the circuits of FIGS. 1a and FIG. 2a.

FIG. 3b is a current vs. time plot comparing the current through the power MOSFETs from the circuits of FIGS. 1a and FIG. 2a.

In the drawings, like or similar features are typically labeled with the same reference numbers.

DETAILED DESCRIPTION OF THE INVENTION

Figure 4:
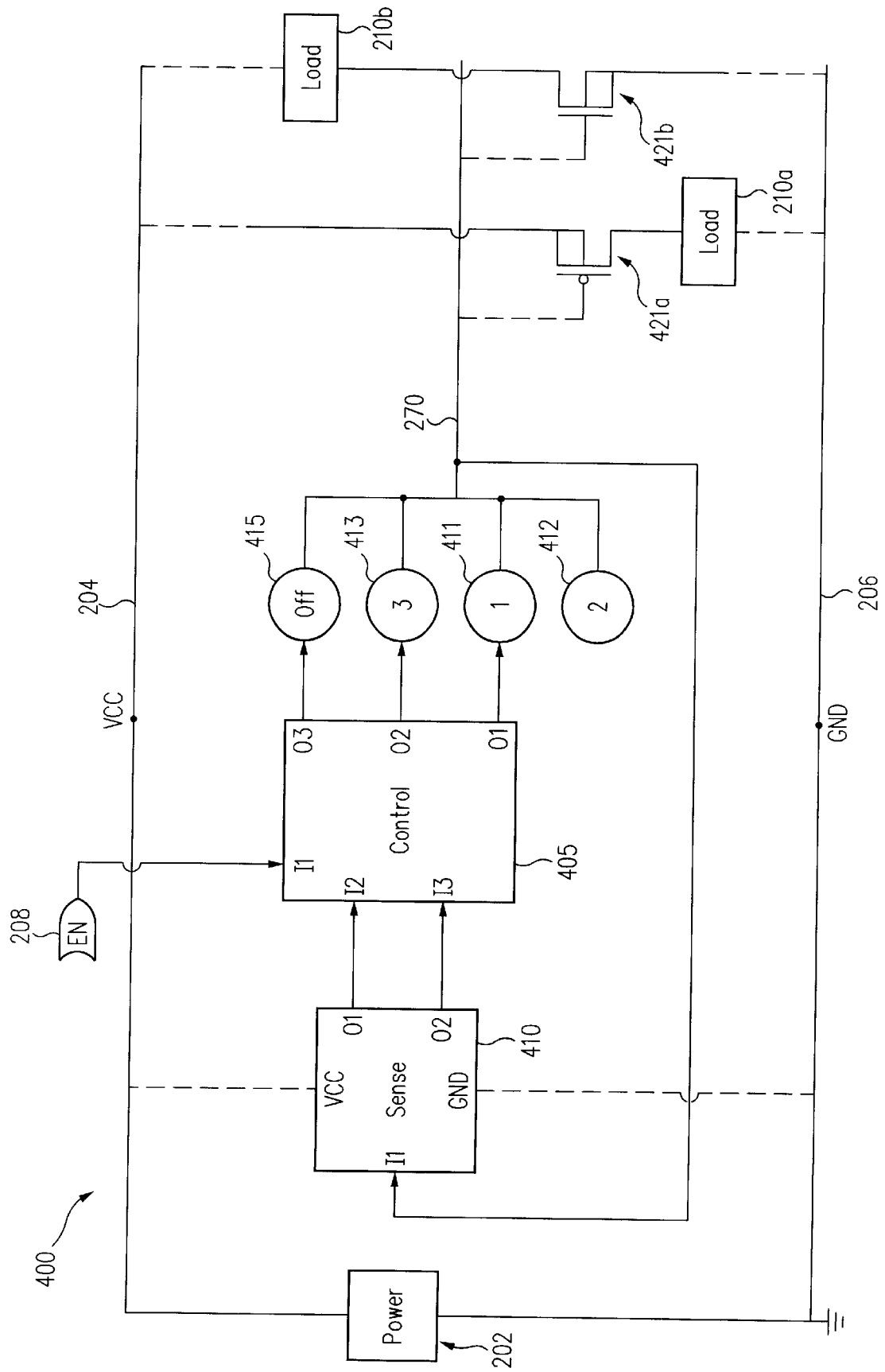
FIG. 4 is a block diagram of a circuit to limit the rush current through a power MOSFET switch according to the present invention.

In accordance with the present invention, FIG. 4 is a block diagram of a circuit 400 to limit the rush current through a p-type power MOSFET 421a or an n-type power MOSFET 421b, each used as switches, to a load 210a or a load 210b, respectively. Circuit 400 includes a power source 202, which has a VCC terminal 204 (also called a power terminal) and a ground terminal 206.

In the case of p-type power MOSFET 421a, the body and source of power MOSFET 421a are coupled to VCC terminal 204. Load 210a is coupled to the drain of power MOSFET 421a. Load 210a may also be coupled to ground terminal 206, or load 210a may be coupled to an alternative ground reference source (not shown). A sense circuit 410 is coupled to a gate 270 of power MOSFET 421a. Sense circuit 410 is shown coupled to VCC terminal 204 and ground terminal 206 to share power and ground reference rails with power MOSFET 421a. It is possible, however, that sense circuit 410 may receive power and ground reference voltages from alternative sources (not shown).

The outputs of sense circuit 410 are coupled to two inputs of a control circuit 405. An enable signal 208 is also an input to control circuit 405. A first drive force 411 is coupled between a first output of control circuit 405 and gate 270 of power MOSFET 421a. A second drive force 412 is coupled to gate 270 of power MOSFET 421a. A third drive force 413 is coupled between a second output of control circuit 405 and gate 270 of power MOSFET 421a. An off circuit 415 is coupled between a third output of control circuit 405 and gate 270 of power MOSFET 421a. Off circuit 415 is used to rapidly turn off power MOSFET 421a during the off-state of enable signal 208.

N-type power MOSFET 421b is coupled in circuit 400 similarly to p-type power MOSFET 421a. In particular, the gate connections for power MOSFETs 421a and 421b are similar as shown in FIG. 4. Accordingly, to avoid redundancy, our discussion will focus on differences in the connections to n-type MOSFET 421b. The body and source of n-type power MOSFET 421b are coupled to ground terminal 206. Load 210b is coupled to the drain of power MOSFET 421b. Load 210b may also be coupled to VCC terminal 204, or load 210b may be coupled to an alternative VCC reference source (not shown).

Circuit 400 operates similarly for both p-type power MOSFET 421a and n-type power MOSFET 421b. To avoid confusion, the following discussion is made with reference to p-type power MOSFET 421a, but is also applicable to n-type power MOSFET 421b. Differences in operation for the two power MOSFETs 421a and 421b are highlighted where appropriate.

Second drive force 412 is coupled to act on gate 270 of power MOSFET 421a during an entire finite turn-on time. Upon receiving enable signal 208 to turn on power MOSFET 421a, control circuit 405 applies first drive force 411 to gate 270 of power MOSFET 421a in an initial turn-on stage. First drive force 411 is stronger than second drive force 412 so that first drive force 411 overpowers second drive force 412 to rapidly charge the gate 270 to source (VCC) voltage of power MOSFET 421a. The gate 270 to source (VCC) voltage of p-type power MOSFET 421a is charged negatively, while the gate 270 to source (VCC) voltage of n-type power MOSFET 421b is charged positively.

Sense circuit 410 senses when power MOSFET 421a has been enhanced by a first level. This may occur, when the gate 270 to source (VCC) voltage of power MOSFET 421a has reached, for example, one threshold voltage. At this time, control circuit 405 turns off first drive force 411 allowing second drive force 412 to gradually, linearly turn on power MOSFET 421a. Control circuit 405 holds both first drive circuit 411 and third drive circuit 413 off during this middle turn-on stage.

Sense circuit 410 senses when power MOSFET 421 has been enhanced by a second level. This may occur when the gate 270 to source (VCC) voltage of power MOSFET 421a has reached, for example, two threshold voltages. At this time, control circuit 405 applies third drive force 413 to gate 270 of power MOSFET 421a. Third drive force 413 is stronger than second drive force 412 so that it overpowers second drive force 412 to maximize the enhancement of power MOSFET 421a and minimize its on resistance in a final turn-on stage.

The scheme employed by control circuit 405 utilizes almost all of the allotted turn-on time to linearly control the enhancement of p-type power MOSFET 421a, or n-type power MOSFET 421b, during the middle turn-on stage. This control scheme provides the optimal slew rate control during the finite turn-on time and minimizes the rush current through power MOSFET 421a or power MOSFET 421b.

Figure 2A:
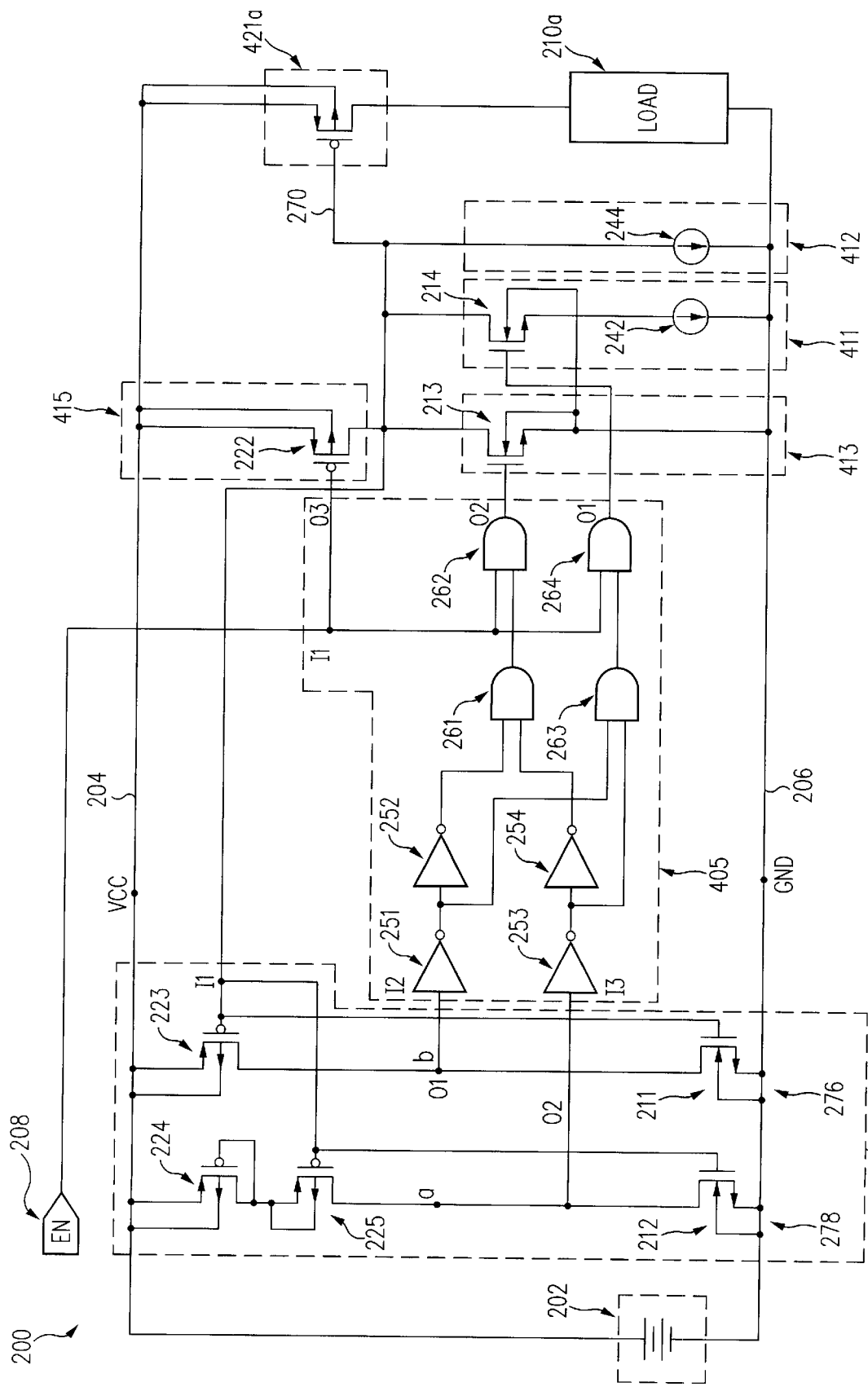
FIG. 2a is a schematic diagram of a circuit to limit the rush current through a power MOSFET switch according to one embodiment of the present invention.

FIG. 2a is a schematic diagram of a circuit 200 designed to limit the rush current conducted through p-type power MOSFET 421a, used as a switch, to load 210a according to one embodiment of the present invention. The circuit elements of circuit 200 corresponding to blocks identified in circuit 400 of FIG. 4 are delineated by dashed lines and are identified accordingly. Circuit 200 includes power source 202, shown as a battery, which provides a voltage VCC. The battery has VCC terminal 204 (also called a power terminal), labeled VCC, and ground terminal 206, labeled GND. The source and body of power MOSFET 421a are coupled to VCC terminal 204. Load 210a is coupled between the drain of power MOSFET 421a and, in this embodiment, ground terminal 206. It is possible, however, for load 210a to be coupled between the drain of power MOSFET 421a and an alternative ground reference voltage source (not shown).

A second pMOSFET 222 is used to turn power MOSFET 421a off when needed. The source and body of second pMOSFET 222 are coupled to VCC terminal 204. The drain of second pMOSFET 222 is coupled to gate 270 of power MOSFET 421a.

The three different drive forces that can be applied to gate 270 of power MOSFET 421a are supplied by a fourth nMOSFET 214 and a first current source 242, a second current source 244, and a third nMOSFET 213. First current source 242 is coupled from the source of fourth nMOSFET 214 to ground terminal 206. The drain of fourth nMOSFET 214 is coupled to gate 270 of power MOSFET 421a. The body of fourth nMOSFET 214 is coupled to ground terminal 206. Second current source 244 is coupled from gate 270 of power MOSFET 421a to ground terminal 206. The source and body of third nMOSFET 213 are coupled to ground terminal 206. The drain of third nMOSFET 213 is coupled to gate 270 of power MOSFET 421a. First current source 242 is stronger than second current source 244, which means first current source 242 can supply a larger current than second current source 244.

Together, a third pMOSFET 223 and a first nMOSFET 211 form a first sense inverter 276 that senses when power MOSFET 421a has been enhanced by a first level. The body and source of third pMOSFET 223 are coupled to VCC terminal 204. The body and source of first nMOSFET 211 are coupled to ground terminal 206. The drain of third pMOSFET 223, the output (labeled b) of first sense inverter 276, is coupled to the drain of first nMOSFET 211. The gate of third pMOSFET 223 is coupled to the gate of first nMOSFET 211 and to gate 270 of power MOSFET 421a.

First nMOSFET 211 is a weak transistor compared to third pMOSFET 223. This indicates that third pMOSFET 223 will dominate the behavior of first sense inverter 276. The output (labeled b) of first sense inverter 276 formed by these two transistors will be pulled high when the voltage at the gates of the two transistors lowers sufficiently so that the gate to source voltage of third pMOSFET 223 is less than the threshold voltage of third pMOSFET 223. Third pMOSFET 223 is designed to have a threshold voltage about equal to the threshold voltage of power MOSFET 421a. Thus, first sense inverter 276 is tripped when the gate 270 to source (VCC terminal 204) voltage of power MOSFET 421a is about one threshold voltage.

Together, a fourth pMOSFET 224, a fifth pMOSFET 225, and a second nMOSFET 212 form a second sense inverter 278 that senses when power MOSFET 421a has been enhanced by a second level. The body and source of fourth pMOSFET 224 are coupled to VCC terminal 204. The gate of fourth pMOSFET 224 is coupled to the drain of fourth pMOSFET 224 in a "diode connection." The body and source of fifth pMOSFET 225 are coupled to the drain and gate of fourth pMOSFET 224. The body and source of second nMOSFET 212 are coupled to ground terminal 206. The drain of fifth pMOSFET 225, the output (labeled a) of second sense inverter 278, is coupled to the drain of second nMOSFET 212. The gate of fifth pMOSFET 225 is coupled to the gate of second nMOSFET 212 and to gate 270 of power MOSFET 421a.

Second nMOSFET 212 is a weak transistor compared to fifth pMOSFET 225 and fourth pMOSFET 224. This indicates that fifth pMOSFET 225 and fourth pMOSFET 224 will dominate the behavior of second sense inverter 278. The output (labeled a) of second sense inverter 278 formed by these three transistors will be pulled high when the voltage at the gate of fifth pMOSFET 225 lowers sufficiently. This will occur when the voltage difference between the gate of fifth pMOSFET 225 and VCC terminal 204 is less than the sum of the threshold voltages of fifth pMOSFET 225 and fourth pMOSFET 224. Fifth pMOSFET 225 and fourth pMOSFET 224 are each designed to have threshold voltages about equal to the threshold voltage of power MOSFET 421a. Thus, second sense inverter 278 is tripped when the gate 270 to source (VCC terminal 204) voltage of power MOSFET 421a is about two threshold voltages.

First nMOSFET 211 and second nMOSFET 212 can be made weaker than third pMOSFET 223, fourth pMOSFET 224, and fifth pMOSFET 225 by, for example, designing first nMOSFETs 211 and second nMOSFETs 212 with narrower widths than third, fourth, and fifth pMOSFETs 223, 224, and 225. This is done so that third, fourth, and fifth pMOSFETs 223, 224, and 225 dominate the behavior of first sense inverter 276 and second sense inverter 278. For example, as soon as third pMOSFET 223 turns on, it pulls the output of first sense inverter 276 high, even though first nMOSFET 211 is also still fully on. Second sense inverter 278 operates similarly to first sense inverter 278.

Logic control for the embodiment of circuit 200 is provided by four inverters and four two-input AND gates. The logic function of an inverter is to output the opposite of the input. If the input is "high" (for example, VCC), the output is "low" (for example, 0V or GND). The logic function of a two-input AND gate is to output a low, unless both inputs are high in which case the output is also high.

The input of a first inverter 251 is coupled to the drains of third pMOSFET 223 and first nMOSFET 211, which are the output (labeled b) of first sense inverter 276. The output of first inverter 251 is coupled to the input of a second inverter 252 and to the first input of a third AND gate 263. The output of second inverter 252 is coupled to the first input of a first AND gate 261. The input of a third inverter 253 is coupled to the drains of fifth pMOSFET 225 and second nMOSFET 212, which are the output (labeled a) of second sense inverter 278. The output of third inverter 253 is coupled to the input of a fourth inverter 254 and to the second input of third AND gate 263. The output of fourth inverter 254 is coupled to the second input of first AND gate 261. The output of first AND gate 261 is coupled to the second input of a second AND gate 26 2. The output of second AND gate 262 is coupled to the gate of third nMOSFET 213. The output of third AND gate 263 is coupled to the second input of a fourth AND gate 264. The output of fourth AND gate 264 is coupled to the gate of fourth nMOSFET 214.

Enable signal 208, labeled EN, triggers changes in the behavior of circuit 200. Enable signal 208 can be provided in a number of ways. For example, it could be generated by an external switch or a switch internal to power source 202. Enable signal 208 is coupled to the gate of second pMOSFET 222, the first input of second AND gate 262, and the first input of fourth AND gate 264.

When enable signal 208 is low, power MOSFET 421a is in an off state. The low enable signal 208 applied at the first inputs of second and fourth AND gates 262, 264 results in low outputs from second and fourth AND gates 262, 264. Since second and fourth AND gates 262, 264 control the gate voltages of third and fourth nMOSFETs 213 and 214, respectively, this turns third and fourth nMOSFETs 213 and 214 off. The low enable signal 208 applied at the gate of second pMOSFET 222 turns second pMOSFET 222 on. A current flows from VCC terminal 204 through second pMOSFET 222 and second current source 244. This pulls the drain of second pMOSFET 222, and gate 270 of power MOSFET 421a, to the high voltage of VCC terminal 204. This turns power MOSFET 421a off and isolates load 210a. Thus, just before enable signal 208 transitions from low to high, the voltage at gate 270 of power MOSFET 421a is very close to VCC terminal 204, i.e. high.

After enable signal 208 transitions from low to high, power MOSFET 421a is turned on in three stages controlled by the logic circuitry in control circuit 405. A high enable signal 208 turns second pMOSFET 222 off. Initially, since the voltage at gate 270 of power MOSFET 421a starts at logic high, the inputs to first sense inverter 276 and second sense inverter 278 are also high. Thus, output b of first sense inverter 276 and output a of second sense inverter 278 are both logic low. The low outputs b and a are applied as the inputs to first inverter 251 and third inverter 253, respectively, resulting in high outputs from first inverter 251 and third inverter 253.

The high outputs from first inverter 251 and third inverter 253 are applied as inputs to second inverter 252 and fourth inverter 254, respectively, resulting in low outputs from second inverter 252 and fourth inverter 254. The low outputs from second inverter 252 and fourth inverter 254 are applied as inputs to first AND gate 261 resulting in a low output from first AND gate 261. The low output from first AND gate 261, along with high enable signal 208, are applied as inputs to second AND gate 262 resulting in a low output from second AND gate 262 which holds third nMOSFET 213 off.

The high outputs from first inverter 251 and third inverter 253 are also applied as inputs to third AND gate 263 resulting in a high output from third AND gate 263. The high output from third AND gate 263 along with the high enable signal 208 are applied as inputs to fourth AND gate 264 resulting in a high output from fourth AND gate 264 which turns on fourth nMOSFET 214.

Figure 2B:
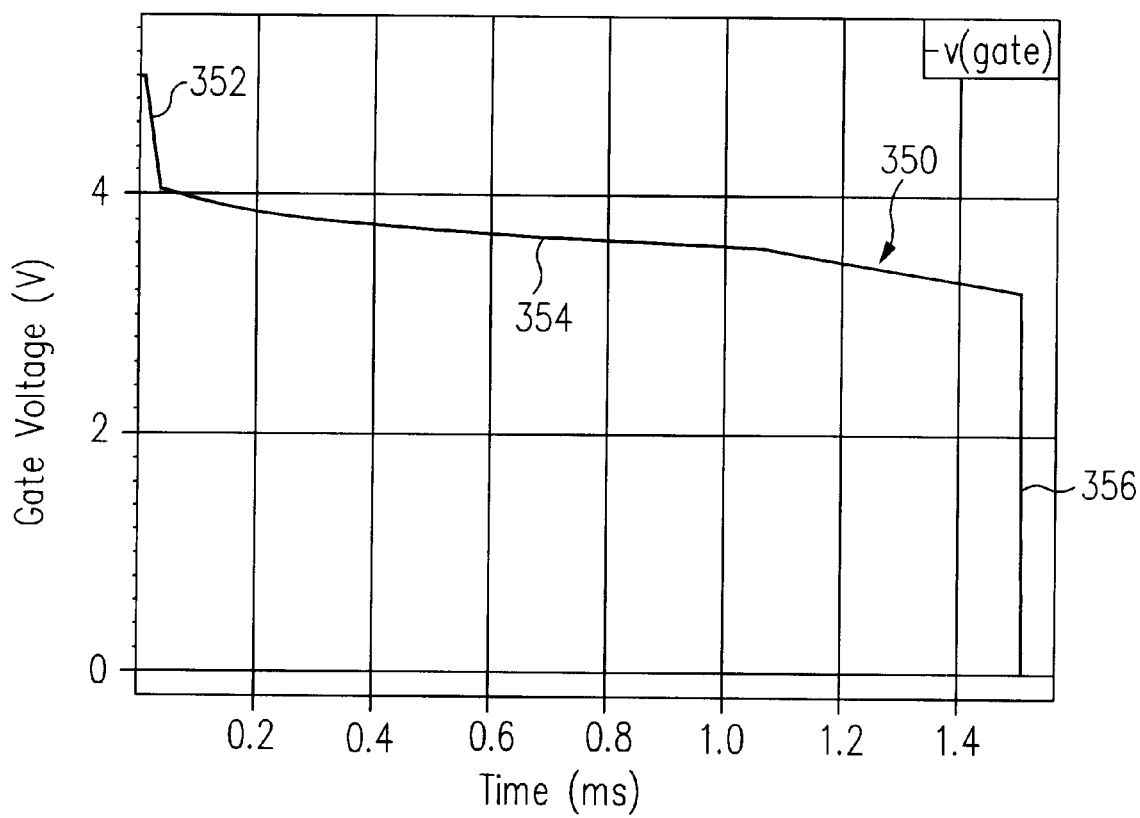

When fourth nMOSFET 214 turns on, the voltage at gate 270 of power MOSFET 421a is rapidly decreased through the action of first current source 242 (strong) in parallel with second current source 244 (weak). FIG. 2b is a gate voltage vs. time plot for power MOSFET 421a of circuit 200 of FIG. 2a. The plot shows a gate voltage curve 350 at gate 270 of power MOSFET 421a during a finite turn-on time, for example, 1.6 ms. At t=0 ms, the voltage at gate 270 is VCC, for example, 5V. As shown in the plot, the voltage at gate 270 of power MOSFET 421a decreases rapidly in an initial stage 352 as power MOSFET 421a begins to turn on.

The voltage at gate 270 of power MOSFET 421a continues to decrease until the voltage from gate 270 to source (VCC terminal 204) of power MOSFET 421a reaches one threshold voltage. The voltage at gate 270 is also the input for first and second sense inverters 276, 278. Since third pMOSFET 223 has a similar threshold voltage to power MOSFET 421a, third pMOSFET 223 turns on pulling output b of first sense inverter 276 high. Output a of second sense inverter 278 remains low. The high output b propagates through the logic circuitry resulting in low outputs from first inverter 251, third AND gate 263, and fourth AND gate 264, which turns fourth nMOSFET 214 off.

When fourth nMOSFET 214 turns off, the voltage at gate 270 of power MOSFET 421a is decreased slowly by second current source 244. As seen in FIG. 2b, power MOSFET 421a is enhanced by one threshold voltage when the voltage at gate 270 reaches 4V, which is near t=0.05 ms, for VCC=5V and threshold voltage $V_T$=−1V, for example. Thereafter, in a middle stage 354, the voltage at gate 270 of power MOSFET 421a is reduced slowly and linearly in response to second current source 244.

The voltage at gate 270 of power MOSFET 421a continues to decrease slowly until the voltage from gate 270 to source (VCC terminal 204) of power MOSFET 421a reaches twice the threshold voltage of power MOSFET 421a. With an input of twice the threshold voltage (the gate to source voltage of power MOSFET 421a), fourth and fifth pMOSFETs 224 and 225 of second sense inverter 278 turn on, pulling output a high. Output b of first sense inverter 276 remains high. The high output a propagates through the logic circuitry resulting in a low output from third inverter 253, and high outputs from fourth inverter 254, first AND gate 261, and second AND gate 262, which turns third nMOSFET 213 on.

When third nMOSFET 213 turns on, the voltage at gate 270 of power MOSFET 421a is pulled rapidly to ground terminal 206, thus applying the maximum drive to power MOSFET 421a. This, a final stage 356 in the turn-on of power MOSFET 421a, is seen in FIG. 2b when the voltage at gate 270 reaches 3V, which is near t=1.5 ms, for VCC=5V and $V_T$=−1V.

The turn-on scheme is summarized in Table 1 which shows the logic states of outputs a and b, the states of nMOSFETs 213 and 214, and the drive force on gate 270 of power MOSFET 421a for different ranges of gate 270 to source (VCC terminal 204) voltage. In response to enable signal 208, the control circuitry identifies three turn-on stages of power MOSFET 421a and changes the drive on gate 270 of power MOSFET 421a accordingly. In initial stage 352, the voltage from gate 270 to source (VCC terminal 204) is above one threshold voltage. In this case, the voltage on gate 270 of power MOSFET 421a is decreased rapidly by first current source 242 (strong). In middle stage 354, the voltage from gate 270 to source (VCC terminal 204) is between one and two threshold voltages. In this case, the voltage on gate 270 of power MOSFET 421a is decreased slowly by second, current source 244 (weak). In final stage 356, the voltage from gate 270 to source (VCC terminal 204) is below two threshold voltages. In this case, the voltage on gate 270 of power MOSFET 421a is decreased rapidly to ground terminal 206 by third nMOSFET 213.

TABLE 1

| $V_{GS} = V_G - V_{CC}$ | a | b | 214 | 213 | Drive force on gate 270 |
|---|---|---|---|---|---|
| $V_T < V_G - V_{CC}$ | 0 | 0 | on | off | first current source 242 (strong) and second current source 244 (weak) |
| $2 V_T < V_G - V_{CC} < V_T$ | 0 | 1 | off | off | second current source 244 (weak) |
| $V_G - V_{CC} < 2V_T$ | 1 | 1 | off | on | nMOSFET 213 and second current source 244 (weak) |

Figure 1A:
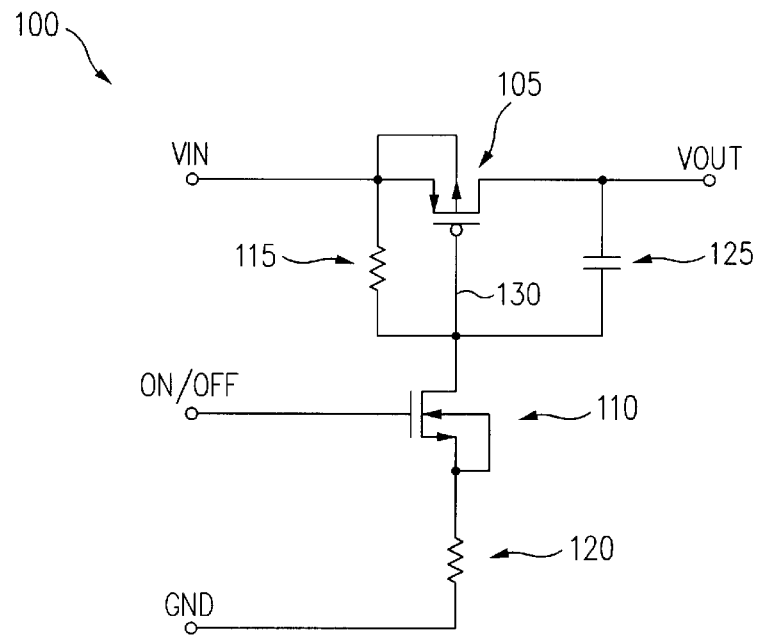
FIG. 1a is a prior art circuit to control rush current.
Figure 1B:
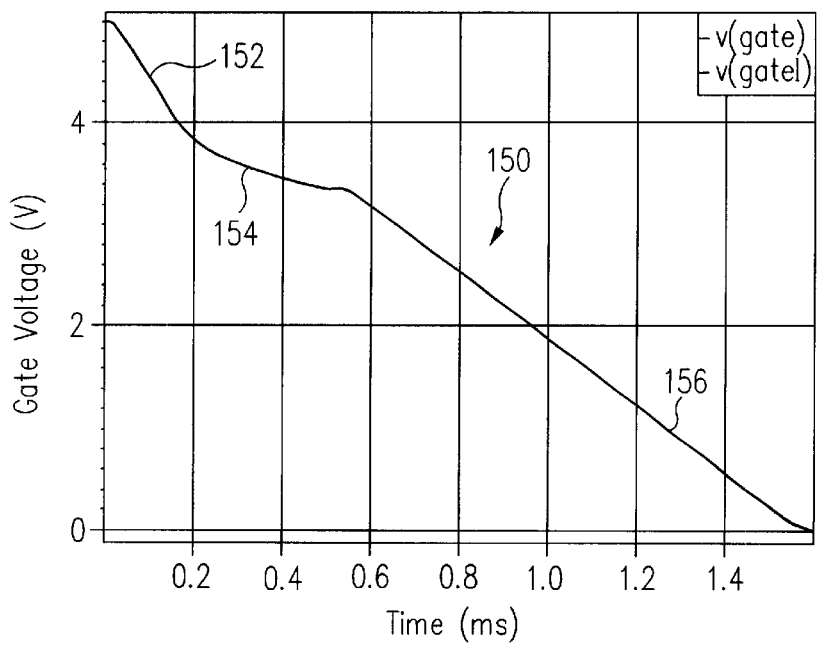
Figure 1C:
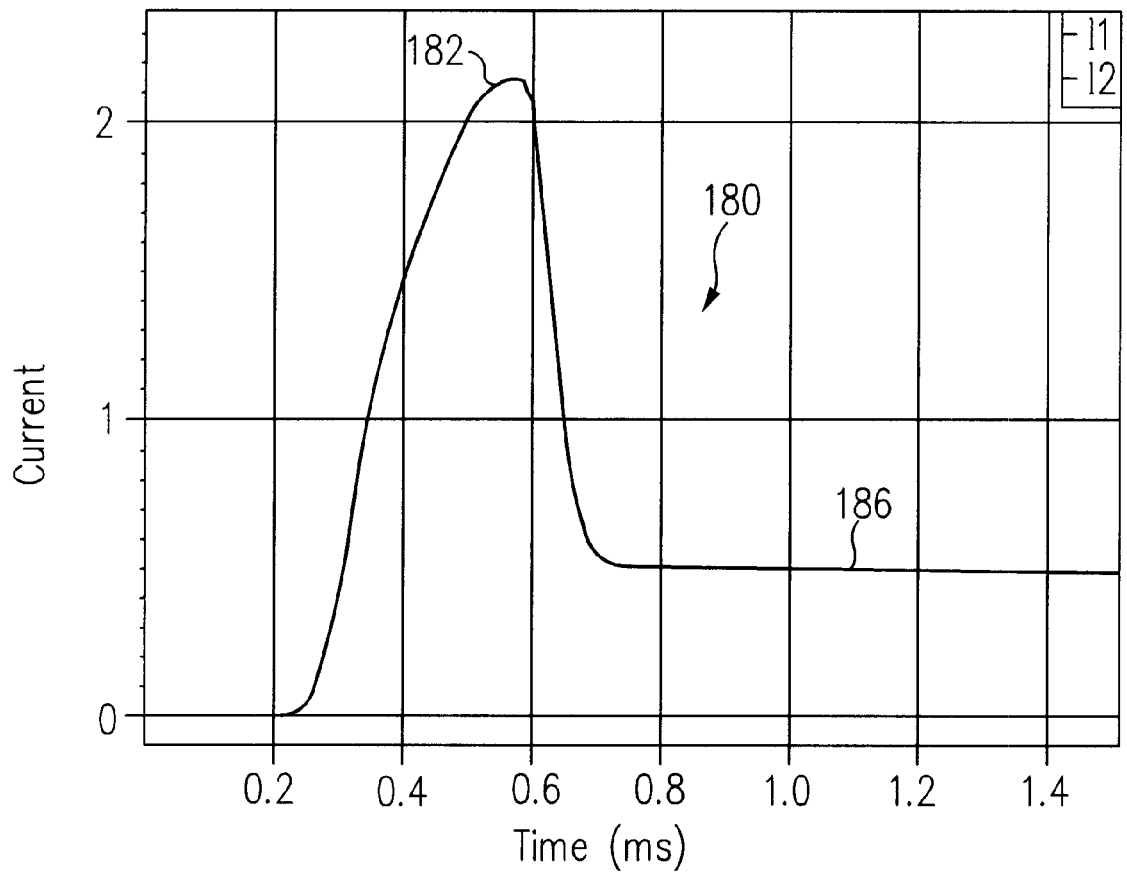
Figure 3A:
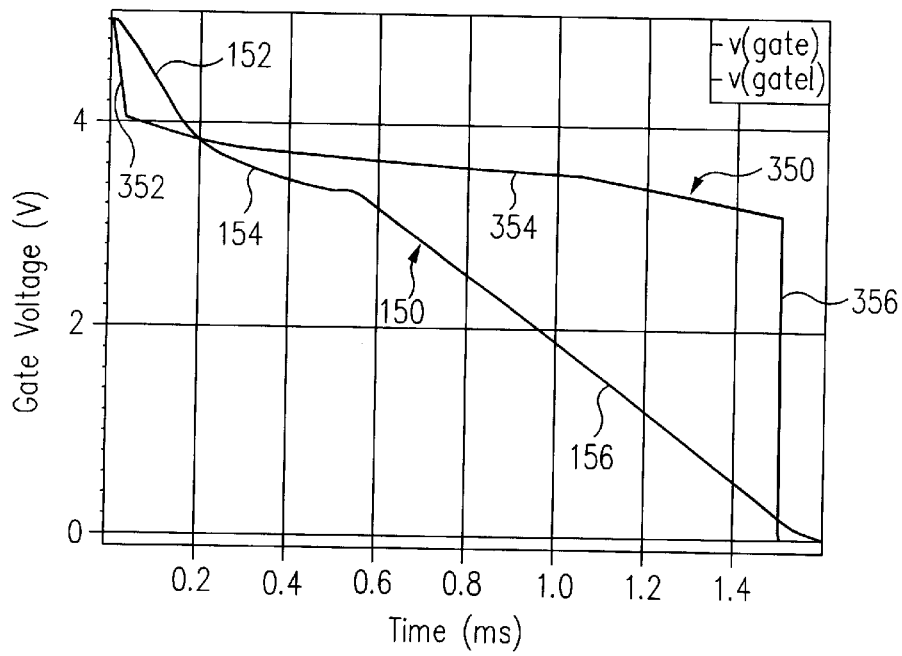

The plot in FIG. 3a compares gate voltage curve 150 for power MOSFET 105 of prior art circuit 100 (see FIG. 1a) to gate voltage curve 350 for power MOSFET 421a of circuit 200, according to this embodiment of the present invention (see FIG. 2a). Dead time is the time until the gate to source voltage of the power MOSFET reaches the first level, for example, one threshold voltage. The dead time during initial stage 352 of turn-on before power MOSFET 421a starts conducting in circuit 200 is substantially reduced compared to initial stage 152 of prior art circuit 100. Additionally, after the power MOSFETs have been enhanced by the second level (i.e., two threshold voltages), the duration of the final stage 356 of turn-on to maximum gate drive in circuit 200 is also substantially reduced compared to final stage 156 of prior art circuit 100.

Since the durations of initial and final stages 352, 356 of turn-on of power MOSFET 421a are minimized, circuit 200 uses almost all of the allowed slew rate control turn-on time in middle stage 354. In middle stage 354, power MOSFET 421a is turned on linearly and slowly resulting in a linear increase in the conductivity of power MOSFET 421a. Thus, the control scheme described by the present invention achieves a much slower and more linear turn-on of p-type power MOSFET 421a than prior art solutions, limiting both rush current through p-type power MOSFET 421a and voltage disturbance to power source 202.

Figure 3B:
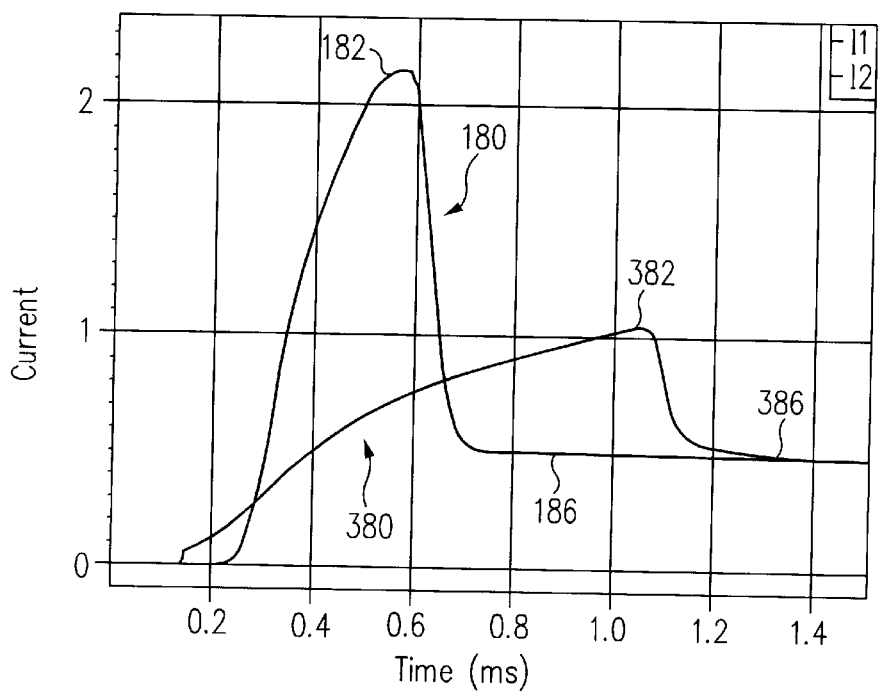

The plot in FIG. 3b compares current curve 180 for power MOSFET 105 of prior art circuit 100 to a current curve 380 for power MOSFET 421a of circuit 200 according to this embodiment of the present invention. Prior to a final current 386, a peak rush current 382 through power MOSFET 421a is reduced by more than a factor of two using circuit 200 compared to peak current 182 of prior art circuit 100. Thus, a more controlled current is delivered to load 210a in circuit 200.

Figure 5:
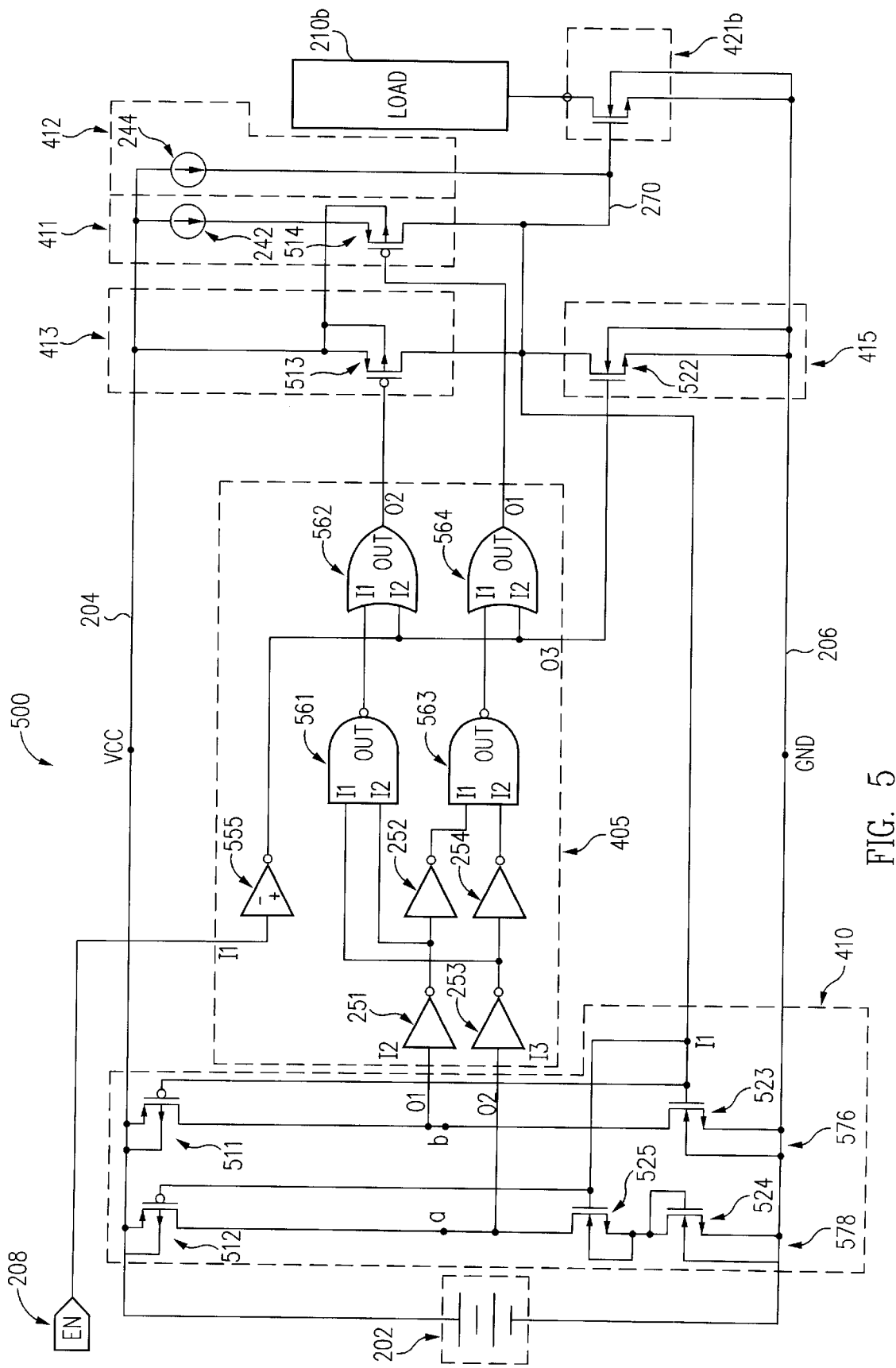
FIG. 5 is a schematic diagram of a circuit to limit the rush current through a power MOSFET switch according to another embodiment of the present invention.

FIG. 5 is a schematic diagram of a circuit 500 designed to limit the rush current conducted through n-type power MOSFET 421b, used as a switch, to load 210b according to another embodiment of the present invention. The circuit elements of circuit 500 corresponding to blocks identified in circuit 400 of FIG. 4 are delineated by dashed lines and are identified accordingly. Circuit 500 of FIG. 5 is similar to circuit 200 of FIG. 2a. Accordingly, to avoid redundancy, our discussion will focus on differences in the between circuit 200 and circuit 500.

The source and body of n-type power MOSFET 421b are coupled to ground terminal 206. Load 210b is coupled between the drain of power MOSFET 421b and, in this embodiment, an alternative VCC terminal (not shown). It is possible, however, for load 210b to be coupled between the drain of power MOSFET 421b and VCC terminal 204.

Off circuit 415 of circuit 500 is coupled between gate 270 of power MOSFET 421b and ground terminal 206, rather than VCC terminal 204 as in circuit 200 of FIG. 2a. Off circuit 415 of circuit 500 includes a second nMOSFET 522, with the drain coupled to gate 270 of power MOSFET 421b, to pull the gate 270 voltage to ground terminal 206, coupled to the body and source of second nMOSFET 522, when needed.

First drive force 411, second drive force 412, and third drive force 413 of circuit 500 are coupled between gate 270 of power MOSFET 421b and VCC terminal 204, rather than ground terminal 206 as in circuit 200 of FIG. 2a. First drive force 411 includes a fourth pMOSFET 514, with the drain coupled to gate 270 of power MOSFET 421b and the body coupled to VCC terminal 204, and first current source 242 coupled between VCC terminal 204 and the source of fourth pMOSFET 514. Second drive force 412 includes second current source 244 coupled between VCC terminal 204 and gate 270 of power MOSFET 421b. Third drive force 413 includes a third pMOSFET 513 with the drain coupled to gate 270 of power MOSFET 421b and the source and body coupled to VCC terminal 204. In circuit 500, first current source 242 is stronger than second current source 244, similarly to circuit 200 of FIG. 2a.

Sense circuit 410 in circuit 500 of FIG. 5 includes a first sense inverter 576 and a second sense inverter 578, which function similarly to sense inverters 276 and 278 of circuit 200 of FIG. 2a. Together, a third nMOSFET 523 and a first pMOSFET 511 form first sense inverter 576 that senses when power MOSFET 421b has been enhanced by a first level. Together, a fourth nMOSFET 524, a fifth nMOSFET 525, and a second pMOSFET 512 form second sense inverter 578 that senses when power MOSFET 421b has been enhanced by a second level.

The source and body terminals of first pMOSFET 511 and second pMOSFET 512 are coupled to VCC terminal 204. The source and body terminals of third nMOSFET 523 and fourth nMOSFET 524 are coupled to ground terminal 206. The gate and drain of fourth nMOSFET 524 are coupled together in a diode connection to the source and body of fifth nMOSFET 525.

The drains of third nMOSFET 523 and first pMOSFET 511 are coupled together to form the output of first sense inverter 576, labeled b, which is coupled to a second input of control circuit 405. The drains of fifth nMOSFET 525 and second pMOSFET 512 are coupled together to form the output of second sense inverter, labeled a, which is coupled to a third input of control circuit 405.

The inputs of sense inverters 576 and 578, including the gates of first pMOSFET 511, second pMOSFET 512, third rinMOSFET 523, and fifth nMOSFET 525, are coupled together and to gate 270 of power MOSFET 421b. While in circuit 200 of FIG. 2a the nMOSFETs were designed weaker than the pMOSFETs of sense inverters 276 and 278, the reverse is true in circuit 500 of FIG. 5. The pMOSFETs of sense inverters 576 and 578 of circuit 500 are designed weaker (i.e., with narrower widths) than the nMOSFETs so that the nMOSFETs will dominate the behavior of sense inverters 576 and 578.

Third nMOSFET 523, fourth nMOSFET 524, and fifth nMOSFET 525 are each designed to have a threshold voltage about equal to the threshold voltage of power MOSFET 421b. Thus, the first level sensed by first sense inverter 576 is about equal to one threshold voltage of power MOSFET 421b, and the second level sensed by second sense inverter 578 is about equal to two threshold voltages of power MOSFET 421b.

Logic control for circuit 500 is provided in control circuit 405 by five inverters, two two-input NAND gates, and two two-input OR gates. The logic function of a two-input NAND gate is to output a high, unless both inputs are high in which case the output is low. The logic function of a two-input OR gate is to output a high if either of the inputs are high.

The inputs of first and third inverters 251 and 253 are coupled to the outputs of first and second sense inverters 576 and 578, labeled b and a, respectively. The outputs of first and third inverters 251 and 253 are coupled to the inputs of second and fourth inverters 252 and 254, respectively, and to the inputs of a first NAND gate 561. The outputs of second and fourth inverters 252 and 254 are coupled to the inputs of a second NAND gate 563. The outputs of first and second NAND gates 561 and 563 are coupled to the first inputs of a first OR gate 562 and a second OR gate 564, respectively. Enable signal 208 is coupled to the input of a fifth inverter 555, which has an output coupled to the second inputs of first and second OR gates 562 and 564 and to the gate of second nMOSFET 522 of off circuit 415. The output of second OR gate 564 is coupled to the gate of fourth pMOSFET 514 of first drive force 411. The output of first OR gate 562 is coupled to the gate of third pMOSFET 513 of third drive force 413.

When enable signal 208 is low, power MOSFET 421b is in an off state. The low enable signal 208 is inverted by fifth inverter 555 and applied at the second inputs of first and second OR gates 562 and 564 resulting in high outputs that turn third and fourth pMOSFETs 513 and 514 off. The inverted enable signal 208 applied at the gate of second nMOSFET 522 turns second nMOSFET 522 on. A current flows from VCC terminal 204 through second current source 244 and second nMOSFET 522, which pulls gate 270 of power MOSFET 421a to ground terminal 206 turning power MOSFET 421b off and isolating load 210b.

After enable signal 208 transitions from low to high, power MOSFET 421b is turned on in three stages. The turn-on is controlled by control circuit 405 using a scheme analogous to that used in circuit 200 of FIG. 2a (with appropriate polarity considerations) to turn on p-type power MOSFET 421a. The turn-on scheme is summarized in Table 2 which shows the logic states of outputs a and b, the states of pMOSFETs 513 and 514, and the drive force on gate 270 of power MOSFET 421b for different ranges of gate 270 to source (VCC terminal 204) voltage.

In response to enable signal 208, the control circuitry identifies three turn-on stages of power MOSFET 421b and changes the drive on gate 270 of power MOSFET 421b accordingly. In an initial stage, the voltage from gate 270 to source (GND terminal 206) is below one threshold voltage. In this case, the voltage on gate 270 of power MOSFET 421b is increased rapidly by first current source 242 (strong). In a middle stage, the voltage from gate 270 to source (GND terminal 206) is between one and two threshold voltages. In this case, the voltage on gate 270 of power MOSFET 421b is increased slowly by second current source 244 (weak). In a final stage, the voltage from gate 270 to source (GND terminal 206) is above two threshold voltages. In this case, the voltage on gate 270 of power MOSFET 421b is increased rapidly to VCC terminal 204 by third pMOSFET 513.

For circuit 500 of FIG. 5, the durations of the initial and final stages of turn-on of power MOSFET 421b are minimized. Similar to circuit 200 of FIG. 2a, circuit 500 uses almost all of the allowed slew rate control turn-on time in the middle stage, where power MOSFET 421b is turned on linearly and slowly resulting in a linear increase in the conductivity of power MOSFET 421b. Thus, the control scheme described by the present invention achieves a much slower and more linear turn-on of n-type power MOSFET 421b than prior art solutions, limiting both rush current through n-type power MOSFET 421b and voltage disturbance to power source 202.

TABLE 2

| $V_{GS} = V_G - V_{GND}$ | a | b | 514 | 513 | Drive force on gate 270 |
|---|---|---|---|---|---|
| $V_G - V_{GND} < V_T$ | 1 | 1 | on | off | first current source 242 (strong) and second current source 244 (weak) |
| $V_T < V_G - V_{GND} < 2V_T$ | 1 | 0 | off | off | second current source 244 (weak) |
| $2V_T < V_G - V_{GND}$ | 0 | 0 | off | on | pMOSFET 513 and second current source 244 (weak) |

The embodiments shown in FIG. 2a and FIG. 5 could be implemented in at least two ways. In a first implementation, discrete packaged components can be placed in close proximity on a circuit board and electrically coupled as appropriate. In this case, the logic gates may be packaged one or more to a package. Sense inverters 276, 278, 576, and 578 and current sources 242 and 244 may each be in discrete packages. The individual MOSFETs, such as power MOSFET 421a, second pMOSFET 222, third nMOSFET 213, and fourth nMOSFET 214 may be packaged one or more to a package. Similarly, power MOSFET 421b, second nMOSFET 522, third pMOSFET 513, and fourth pMOSFET 514 may be packaged one or more to a package. In a second implementation, the circuit elements of circuit 200, or circuit 500, would be fabricated, for example, using a CMOS or BiCMOS process, in a common substrate as a single integrated circuit (IC).

The foregoing embodiments are intended to be illustrative and not limiting of the broad principles of this invention. Many additional embodiments will be apparent to persons skilled in the art. In particular, alternative implementations for the sense, control, off, and three drive circuits will be apparent. The invention is limited only by the following claims.

I claim:

1. A circuit arrangement comprising:

a power source comprising a power terminal and a ground terminal;

a power MOSFET including a gate, a first terminal, a second terminal, and a first threshold voltage, wherein the first terminal of said power MOSFET is coupled to one of said power terminal and said ground terminal of said power source;

a load coupled to said second terminal of said power MOSFET;

a control circuit comprising at least a first input, a second input, and a third input, and at least a first output, a second output, and a third output, wherein the first input of said control circuit is coupled to an enable signal, said control circuit adapted to control the drive force applied to said gate of said power MOSFET to control a turn-on of said power MOSFET and to limit a rush current through said power MOSFET;

a sense circuit comprising at least an input, a first output, and a second output, wherein the input of said sense circuit is coupled to said gate of said power MOSFET, the first output of said sense circuit is coupled to said second input of said control circuit, and the second output of said sense circuit is coupled to said third input of said control circuit, said sense circuit adapted to sense when said power MOSFET has been enhanced by a first level and by a second level;

an off circuit comprising an input and an output, wherein said input of said off circuit is coupled to said third output of said control circuit and said output of said off circuit is coupled to said gate of said power MOSFET, said off circuit adapted to turn said power MOSFET off when necessary;

a first drive circuit comprising an input and an output, wherein the input of said first drive circuit is coupled to said first output of said control circuit and the output of said first drive circuit is coupled to the gate of said power MOSFET, said first drive circuit adapted to adjust the voltage applied to said gate of said power MOSFET at a first rate;

a second drive circuit comprising an output coupled to the gate of said power MOSFET, said second drive circuit adapted to adjust the voltage applied to said gate of said power MOSFET at a second rate that is less than said first rate; and a third drive circuit comprising an input and an output, wherein the input of said third drive circuit is coupled to said second output of said control circuit and the output of said third drive circuit is coupled to the gate of said power MOSFET, said third drive circuit adapted to adjust the voltage applied to said gate of said power MOSFET to a maximum level allowable by said power source at a third rate that is greater than said second rate.

2. The circuit arrangement of claim 1, wherein said power MOSFET is a p-type power MOSFET further including a body coupled to said first terminal.

3. The circuit arrangement of claim 2, wherein said control circuit further comprises:

a first inverter including an input and an output, wherein the input of said first inverter is coupled to said second input of said control circuit;

a second inverter including an input and an output, wherein the input of said second inverter is coupled to said output of said first inverter;

a third inverter including an input and an output, wherein the input of said third inverter is coupled to said third input of said control circuit;

a fourth inverter including an input and an output, wherein the input of said fourth inverter is coupled to said output of said third inverter;

a first AND gate including a first input, a second input, and an output, wherein the first input of said first AND gate is coupled to said output of said second inverter and the second input of said first AND gate is coupled to said output of said fourth inverter;

a second AND gate including a first input, a second input, and an output, wherein the first input of said second AND gate is coupled to said first input of said control circuit, the second input of said second AND gate is coupled to said output of said first AND gate, and the output of said second AND gate is coupled to said second output of said control circuit;

a third AND gate including a first input, a second input, and an output, wherein the first input of said third AND gate is coupled to said output of said first inverter and the second input of said third AND gate is coupled to said output of said third inverter; and a fourth AND gate including a first input, a second input, and an output, wherein the first input of said fourth AND gate is coupled to said first input of said control circuit, the second input of said fourth AND gate is coupled to said output of said third AND gate, and the output of said fourth AND gate is coupled to said first output of said control circuit.

4. The circuit arrangement of claim 2, wherein said off circuit further comprises:

a second p-type MOSFET including a drain, a gate, a source, and a body, wherein the source and the body of said second p-type MOSFET are coupled to said power terminal of said power source, the drain of said second p-type MOSFET is coupled to said output of said off circuit, and the gate of said second p-type MOSFET is coupled to said input of said off circuit.

5. The circuit arrangement of claim 2, wherein said sense circuit further comprises:

a third p-type MOSFET including a drain, a gate, a source, and a body, wherein the source and the body of said third p-type MOSFET are coupled to said power terminal of said power source and the gate of said third p-type MOSFET is coupled to said input of said sense circuit, said third p-type MOSFET having a threshold voltage about equal to said first threshold voltage of said power MOSFET;

a fourth p-type MOSFET including a drain, a gate, a source, and a body, wherein the source and the body of said fourth p-type MOSFET are coupled to said power terminal of said power source and the gate of said fourth p-type MOSFET is coupled to the drain of said fourth p-type MOSFET, said fourth p-type MOSFET having a threshold voltage about equal to said first threshold voltage of said power MOSFET;

a fifth p-type MOSFET including a drain, a gate, a source, and a body, wherein the source and the body of said fifth p-type MOSFET are coupled to said drain of said fourth p-type MOSFET and the gate of said fifth p-type MOSFET is coupled to said input of said sense circuit, said fifth p-type MOSFET having a threshold voltage about equal to said first threshold voltage of said power MOSFET;

a first n-type MOSFET including a drain, a gate, a source, and a body, wherein the source and the body of said first n-type MOSFET are coupled to said ground terminal of said power source, the gate of said first n-type MOSFET is coupled to said gate of said third p-type MOSFET and to said input of said sense circuit, and the drain of said first n-type MOSFET is coupled to the drain of said third p-type MOSFET and to said first output of said sense circuit, said first n-type MOSFET being weaker than said third p-type MOSFET, and said third p-type MOSFET and said first n-type MOSFET forming a first sense inverter responsive to a voltage at said input of said sense circuit corresponding to enhancement of said power MOSFET by said first level; and a second n-type MOSFET including a drain, a gate, a source, and a body, wherein the source and the body of said second n-type MOSFET are coupled to said ground terminal of said power source, the gate of said second n-type MOSFET is coupled to said gate of said fifth p-type MOSFET and to said input of said sense circuit, and the drain of said second n-type MOSFET is coupled to the drain of said fifth p-type MOSFET and to said second output of said sense circuit, said second n-type MOSFET being weaker than said fifth p-type MOSFET, and said fourth p-type MOSFET, said fifth p-type MOSFET, and said second n-type MOSFET forming a second sense inverter responsive to a voltage at said input of said sense circuit corresponding to enhancement of said power MOSFET by said second level.

6. The circuit arrangement of claim 2, wherein said first drive circuit further comprises:

a fourth n-type MOSFET including a drain, a gate, a source, and a body, wherein the body of said fourth n-type MOSFET is coupled to said ground terminal of said power source, the drain of said fourth n-type MOSFET is coupled to said output of said first drive circuit, and the gate of said fourth n-type MOSFET is coupled to said input of said first drive circuit; and a first current source coupled between said source of said fourth n-type MOSFET and said ground terminal of said power source.

7. The circuit arrangement of claim 2, wherein said second drive circuit further comprises:

a second current source coupled between said output of said second drive circuit and said ground terminal of said power source, said second current source being weaker than said first current source.

8. The circuit arrangement of claim 2, wherein said third drive circuit further comprises:

a third n-type MOSFET including a drain, a gate, a source, and a body, wherein the source and the body of said third n-type MOSFET are coupled to said ground terminal of said power source, the drain of said third n-type MOSFET is coupled to said output of said third drive circuit, and the gate of said third n-type MOSFET is coupled to said input of said third drive circuit.

9. The circuit arrangement of claim 2, wherein said first level is equal to said first threshold voltage of said power MOSFET.

10. The circuit arrangement of claim 2, wherein said second level is equal to twice said first threshold voltage of said power MOSFET.

11. The circuit arrangement of claim 1, wherein said power MOSFET is an n-type power MOSFET further including a body coupled to said first terminal.

12. The circuit arrangement of claim 11, wherein said control circuit further comprises:

a first inverter including an input and an output, wherein the input of said first inverter is coupled to said second input of said control circuit;

a second inverter including an input and an output, wherein the input of said second inverter is coupled to said output of said first inverter;

a third inverter including an input and an output, wherein the input of said third inverter is coupled to said third input of said control circuit;

a fourth inverter including an input and an output, wherein the input of said fourth inverter is coupled to said output of said third inverter;

a fifth inverter including an input and an output, wherein the input of said fifth inverter is coupled to said first input of said control circuit;

a first NAND gate including a first input, a second input, and an output, wherein the first input of said first NAND gate is coupled to said output of said third inverter and the second input of said first NAND gate is coupled to said output of said first inverter;

a second NAND gate including a first input, a second input, and an output, wherein the first input of said second NAND gate is coupled to said output of said second inverter and the second input of said second NAND gate is coupled to said output of said fourth inverter;

a first OR gate including a first input, a second input, and an output, wherein the first input of said first OR gate is coupled to said output of said first NAND gate, the second input of said first OR gate is coupled to said output of said fifth inverter, and the output of said first OR gate is coupled to said second output of said control circuit; and a second OR gate including a first input, a second input, and an output, wherein the first input of said second OR gate is coupled to said output of said second NAND gate, the second input of said second OR gate is coupled to said output of said fifth inverter, and the output of said second OR gate is coupled to said first output of said control circuit.

13. The circuit arrangement of claim 11, wherein said off circuit further comprises:

a second n-type MOSFET including a drain, a gate, a source, and a body, wherein the source and the body of said second n-type MOSFET are coupled to said ground terminal of said power source, the drain of said second n-type MOSFET is coupled to said output of said off circuit, and the gate of said second n-type MOSFET is coupled to said input of said off circuit.

14. The circuit arrangement of claim 11, wherein said sense circuit further comprises:

a third n-type MOSFET including a drain, a gate, a source, and a body, wherein the source and the body of said third n-type MOSFET are coupled to said ground terminal of said power source and the gate of said third n-type MOSFET is coupled to said input of said sense circuit, said third n-type MOSFET having a threshold voltage about equal to said first threshold voltage of said power MOSFET;

a fourth n-type MOSFET including a drain, a gate, a source, and a body, wherein the source and the body of said fourth n-type MOSFET are coupled to said ground terminal of said power source and the gate of said fourth n-type MOSFET is coupled to the drain of said fourth n-type MOSFET, said fourth n-type MOSFET having a threshold voltage about equal to said first threshold voltage of said power MOSFET;

a fifth n-type MOSFET including a drain, a gate, a source, and a body, wherein the source and the body of said fifth n-type MOSFET are coupled to said drain of said fourth n-type MOSFET and the gate of said fifth n-type MOSFET is coupled to said input of said sense circuit, said fifth n-type MOSFET having a threshold voltage about equal to said first threshold voltage of said power MOSFET;

a first p-type MOSFET including a drain, a gate, a source, and a body, wherein the source and the body of said first p-type MOSFET are coupled to said power terminal of said power source, the gate of said first p-type MOSFET is coupled to said gate of said third n-type MOSFET and to said input of said sense circuit, and the drain of said first p-type MOSFET is coupled to the drain of said third n-type MOSFET and to said first output of said sense circuit, said first p-type MOSFET being weaker than said third n-type MOSFET, and said third n-type MOSFET and said first p-type MOSFET forming a first sense inverter responsive to a voltage at said input of said sense circuit corresponding to enhancement of said power MOSFET by said first level; and a second p-type MOSFET including a drain, a gate, a source, and a body, wherein the source and the body of said second p-type MOSFET are coupled to said power terminal of said power source, the gate of said second p-type MOSFET is coupled to said gate of said fifth n-type MOSFET and to said input of said sense circuit, and the drain of said second p-type MOSFET is coupled to the drain of said fifth n-type MOSFET and to said second output of said sense circuit, said second p-type MOSFET being weaker than said fifth. n-type MOSFET, and said fourth n-type MOSFET, said fifth n-type MOSFET, and said second p-type MOSFET forming a second sense inverter responsive to a voltage at said input of said sense circuit corresponding to enhancement of said power MOSFET by said second level.

15. The circuit arrangement of claim 11, wherein said first drive circuit further comprises:

a fourth p-type MOSFET including a drain, a gate, a source, and a body, wherein the body of said fourth p-type MOSFET is coupled to said power terminal of said power source, the drain of said fourth p-type MOSFET is coupled to said output of said first drive circuit, and the gate of said fourth p-type MOSFET is coupled to said input of said first drive circuit; and a first current source coupled between said power terminal of said power source and said source of said fourth p-type MOSFET.

16. The circuit arrangement of claim 11, wherein said second drive circuit further comprises:

a second current source coupled between said power terminal of said power source and said output of said second drive circuit, said second current source being weaker than said first current source.

17. The circuit arrangement of claim 11, wherein said third drive circuit further comprises:

a third p-type MOSFET including a drain, a gate, a source, and a body, wherein the source and the body of said third p-type MOSFET are coupled to said power terminal of said power source, the drain of said third p-type MOSFET is coupled to said output of said third drive circuit, and the gate of said third p-type MOSFET is coupled to said input of said third drive circuit.

18. The circuit arrangement of claim 11, wherein said first level is equal to said first threshold voltage of said power MOSFET.

19. The circuit arrangement of claim 11, wherein said second level is equal to twice said first threshold voltage of said power MOSFET.

20. A circuit arrangement comprising:

a power source including a power terminal and a ground terminal;

a p-type power MOSFET including a drain, a gate, a source, a body, and a first threshold voltage, wherein the source and the body of said power MOSFET are coupled to said power terminal of said power source;

a load coupled to said drain of said power MOSFET, said power MOSFET acting as a switch between said power source and said load;

a second p-type MOSFET including a drain, a gate, a source, and a body, wherein the source and the body of said second p-type MOSFET are coupled to said power terminal of said power source, the drain of said second p-type MOSFET is coupled to said gate of said power MOSFET, and the gate of said second p-type MOSFET is coupled to an enable signal;

a third p-type MOSFET including a drain, a gate, a source, and a body, wherein the source and the body of said third p-type MOSFET are coupled to said power terminal of said power source and the gate of said third p-type MOSFET is coupled to said gate of said power MOSFET, said third p-type MOSFET having a threshold voltage about equal to said first threshold voltage of said power MOSFET;

a fourth p-type MOSFET including a drain, a gate, a source, and a body, wherein the source and the body of said fourth p-type MOSFET are coupled to said power terminal of said power source and the gate of said fourth p-type MOSFET is coupled to the drain of said fourth p-type MOSFET, said fourth p-type MOSFET having a threshold voltage about equal to said first threshold voltage of said power MOSFET;

a fifth p-type MOSFET including a drain, a gate, a source, and a body, wherein the source and the body of said fifth p-type MOSFET are coupled to said drain of said fourth p-type MOSFET and the gate of said fifth p-type MOSFET is coupled to said gate of said power MOSFET, said fifth p-type MOSFET having a threshold voltage about equal to said first threshold voltage of said power MOSFET;

a first n-type MOSFET including a drain, a gate, a source, and a body, wherein the source and the body of said first n-type MOSFET are coupled to said ground terminal of said power source, the gate of said first n-type MOSFET is coupled to said gate of said third p-type MOSFET and to said gate of said power MOSFET, and the drain of said first n-type MOSFET is coupled to the drain of said third p-type MOSFET, said first n-type MOSFET being weaker than said third p-type MOSFET;

a second n-type MOSFET including a drain, a gate, a source, and a body, wherein the source and the body of said second n-type MOSFET are coupled to said ground terminal of said power source, the gate of said second n-type MOSFET is coupled to said gate of said fifth p-type MOSFET and to said gate of said power MOSFET, and the drain of said second n-type MOSFET is coupled to the drain of said fifth p-type MOSFET, said second n-type MOSFET being weaker than said fifth p-type MOSFET;

a third n-type MOSFET including a drain, a gate, a source, and a body, wherein the source and the body of said third n-type MOSFET are coupled to said ground terminal of said power source and the drain of said third n-type MOSFET is coupled to said gate of said power MOSFET;

a fourth n-type MOSFET including a drain, a gate, a source, and a body, wherein the body of said fourth n-type MOSFET is coupled to said ground terminal of said power source and the drain of said fourth n-type MOSFET is coupled to said gate of said power MOSFET;

a first current source coupled between said source of said fourth n-type MOSFET and said ground terminal of said power source;

a second current source coupled between said gate of said power MOSFET and said ground terminal of said power source, said second current source being weaker than said first current source;

a first inverter including an input and an output, wherein the input of said first inverter is coupled to said drain of said third p-type MOSFET and to said drain of said first n-type MOSFET;

a second inverter including an input and an output, wherein the input of said second inverter is coupled to said output of said first inverter;

a third inverter including an input and an output, wherein the input of said third inverter is coupled to said drain of said fifth p-type MOSFET and to said drain of said second n-type MOSFET;

a fourth inverter including an input and an output, wherein the input of said fourth inverter is coupled to said output of said third inverter;

a first AND gate including a first input, a second input, and an output, wherein the first input of said first AND gate is coupled to said output of said second inverter and the second input of said first AND gate is coupled to said output of said fourth inverter;

a second AND gate including a first input, a second input, and an output, wherein the first input of said second AND gate is coupled to said enable signal, the second input of said second AND gate is coupled to said output of said first AND gate, and the output of said second AND gate is coupled to said gate of said third n-type MOSFET;

a third AND gate including a first input, a second input, and an output, wherein the first input of said third AND gate is coupled to said output of said first inverter and the second input of said third AND gate is coupled to said output of said third inverter; and a fourth AND gate including a first input, a second input, and an output, wherein the first input of said fourth AND gate is coupled to said enable signal, the second input of said fourth AND gate is coupled to said output of said third AND gate, and the output of said fourth AND gate is coupled to said gate of said fourth n-type MOSFET.

21. The circuit arrangement of claim 20, wherein said first current source is adapted to decrease the voltage at said gate of said power MOSFET at a first rate.

22. The circuit arrangement of claim 21, wherein said second current source is adapted to decrease the voltage at said gate of said power MOSFET linearly at a second rate that is less than said first rate.

23. The circuit arrangement of claim 20, wherein said third p-type MOSFET and said first n-type MOSFET form a first sense inverter responsive to an input voltage to said first sense inverter corresponding to enhancement of said power MOSFET by a first level.

24. The circuit arrangement of claim 20, wherein said fourth p-type MOSFET, said fifth p-type MOSFET, and said second n-type MOSFET form a second sense inverter responsive to an input voltage to said second sense inverter corresponding to enhancement of said power MOSFET by a second level.

25. The circuit arrangement of claim 23, wherein said first level is equal to said first threshold voltage of said power MOSFET.

26. The circuit arrangement of claim 24, wherein said second level is equal to twice said first threshold voltage of said power MOSFET.

27. A circuit arrangement comprising:

a power source including a power terminal and a ground terminal;

an n-type power MOSFET including a drain, a gate, a source, a body, and a first threshold voltage, wherein the source and the body of said power MOSFET are coupled to said ground terminal of said power source;

a load coupled to said drain of said power MOSFET, said power MOSFET acting as a switch between said power source and said load;

a second n-type MOSFET including a drain, a gate, a source, and a body, wherein the source and the body of said second n-type MOSFET are coupled to said ground terminal of said power source, and the drain of said second n-type MOSFET is coupled to said gate of said power MOSFET;

a third n-type MOSFET including a drain, a gate, a source, and a body, wherein the source and the body of said third n-type MOSFET are coupled to said ground terminal of said power source and the gate of said third n-type MOSFET is coupled to said gate of said power MOSFET, said third n-type MOSFET having a threshold voltage about equal to said first threshold voltage of said power MOSFET;

a fourth n-type MOSFET including a drain, a gate, a source, and a body, wherein the source and the body of said fourth n-type MOSFET are coupled to said ground terminal of said power source and the gate of said fourth n-type MOSFET is coupled to the drain of said fourth n-type MOSFET, said fourth n-type MOSFET having a threshold voltage about equal to said first threshold voltage of said power MOSFET;

a fifth n-type MOSFET including a drain, a gate, a source, and a body, wherein the source and the body of said fifth n-type MOSFET are coupled to said drain of said fourth n-type MOSFET and the gate of said fifth n-type MOSFET is coupled to said gate of said power MOSFET, said fifth n-type MOSFET having a threshold voltage about equal to said first threshold voltage of said power MOSFET;

a first p-type MOSFET including a drain, a gate, a source, and a body, wherein the source and the body of said first p-type MOSFET are coupled to said power terminal of said power source, the gate of said first p-type MOSFET is coupled to said gate of said third n-type MOSFET and to said gate of said power MOSFET, and the drain of said first p-type MOSFET is coupled to the drain of said third n-type MOSFET, said first p-type MOSFET being weaker than said third n-type MOSFET;

a second p-type MOSFET including a drain, a gate, a source, and a body, wherein the source and the body of said second p-type MOSFET are coupled to said power terminal of said power source, the gate of said second p-type MOSFET is coupled to said gate of said fifth n-type MOSFET and to said gate of said power MOSFET, and the drain of said second p-type MOSFET is coupled to the drain of said fifth n-type MOSFET, said second p-type MOSFET being weaker than said fifth n-type MOSFET;

a third p-type MOSFET including a drain, a gate, a source, and a body, wherein the source and the body of said third p-type MOSFET are coupled to said power terminal of said power source and the drain of said third p-type MOSFET is coupled to said gate of said power MOSFET;

a fourth p-type MOSFET including a drain, a gate, a source, and a body, wherein the body of said fourth p-type MOSFET is coupled to said power terminal of said power source and the drain of said fourth p-type MOSFET is coupled to said gate of said power MOSFET;

a first current source coupled between said power terminal of said power source and said source of said fourth p-type MOSFET;

a second current source coupled between said power terminal of said power source and said gate of said power MOSFET, said second current source being weaker than said first current source;

a first inverter including an input and an output, wherein the input of said first inverter is coupled to said drain of said third n-type MOSFET and to said drain of said first p-type MOSFET;

a second inverter including an input and an output, wherein the input of said second inverter is coupled to said output of said first inverter;

a third inverter including an input and an output, wherein the input of said third inverter is coupled to said drain of said fifth n-type MOSFET and to said drain of said second p-type MOSFET;

a fourth inverter including an input and an output, wherein the input of said fourth inverter is coupled to said output of said third inverter;

a fifth inverter including an input and an output, wherein the input of said fifth inverter is coupled to an enable signal and the output of said fifth inverter is coupled to said gate of said second n-type MOSFET;

a first NAND gate including a first input, a second input, and an output, wherein the first input of said first NAND gate is coupled to said output of said third inverter and the second input of said first NAND gate is coupled to said output of said first inverter;

a second NAND gate including a first input, a second input, and an output, wherein the first input of said second NAND gate is coupled to said output of said second inverter and the second input of said second NAND gate is coupled to said output of said fourth inverter;

a first OR gate including a first input, a second input, and an output, wherein the first input of said first OR gate is coupled to said output of said first NAND gate, the second input of said first OR gate is coupled to said output of said fifth inverter, and the output of said first OR gate is coupled to said gate of said third p-type MOSFET; and a second OR gate including a first input, a second input, and an output, wherein the first input of said second OR gate is coupled to said output of said second NAND gate, the second input of said second OR gate is coupled to said output of said fifth inverter, and the output of said second OR gate is coupled to said gate of said fourth p-type MOSFET.

28. The circuit arrangement of claim 27, wherein said first current source is adapted to increase the voltage at said gate of said power MOSFET at a first rate.

29. The circuit arrangement of claim 28, wherein said second current source is adapted to increase the voltage at said gate of said power MOSFET linearly at a second rate that is less than said first rate.

30. The circuit arrangement of claim 27, wherein said third n-type MOSFET and said first p-type MOSFET form a first sense inverter responsive to an input voltage to said first sense inverter corresponding to enhancement of said power MOSFET by a first level.

31. The circuit arrangement of claim 27, wherein said fourth n-type MOSFET, said fifth n-type MOSFET, and said second p-type MOSFET form a second sense inverter responsive to an input voltage to said second sense inverter corresponding to enhancement of said power MOSFET by a second level.

32. The circuit arrangement of claim 30, wherein said first level is equal to said first threshold voltage of said power MOSFET.

33. The circuit arrangement of claim 31, wherein said second level is equal to twice said first threshold voltage of said power MOSFET.

34. The circuit arrangement of claim 1, 20, or 27, wherein said circuit arrangement is fabricated as discrete components mounted on a circuit board.

35. The circuit arrangement of claim 1, 20, or 27, wherein said circuit arrangement is fabricated as an integrated circuit.

36. A method to control turn-on rush current in a power MOSFET switch, comprising the steps of:

provilding a power MOSFET including a gate terminal, said power MOSFET acting as a switch between a power source and a load;

turning said power MOSFET off so that said load is isolated in the off-state of an enable signal;

sensing the enhancement of said power MOSFET in the on-state of said enable signal to control the application of three drive forces to said gate terminal of said power MOSFET to turn said power MOSFET on in a finite turn-on time;

applying a first drive force to said gate terminal of said power MOSFET, said first drive force adapted to adjust the voltage applied to said gate terminal of said power MOSFET at a first rate until said power MOSFET is enhanced by a first level;

applying a second drive force to said gate terminal of said power MOSFET, said second drive force adapted to adjust the voltage applied to said gate terminal of said power MOSFET at a second rate that is less than said first rate until said power MOSFET is enhanced by a second level, said second drive force further adapted to limit the rush current delivered to said load through said power MOSFET; and applying a third drive force to said gate terminal of said power MOSFET, said third drive force adapted to adjust the voltage applied to said gate terminal of said power MOSFET at a third rate that is greater than said second rate so that said power MOSFET is enhanced by the maximum allowed by said power source.

37. The method of claim 36, wherein said sensing step comprises the steps of:

using a first sense inverter to sense when said power MOSFET has been enhanced by said first level; and using a second sense inverter to sense when said power MOSFET has been enhanced by said second level.

38. The method of claim 36, wherein said applying a first drive force comprises coupling a first current source to said gate terminal of said power MOSFET.

39. The method of claim 36, wherein said applying a second drive force comprises coupling a second current source to said gate terminal of said power MOSFET, said second current source being weaker than said first current source.

40. The method of claim 36, wherein said applying a third drive force comprises turning on a MOSFET coupled between said gate terminal of said power MOSFET and one terminal of said power source.

41. The method of claim 36, further including controlling said applying a first drive force, said applying a second drive force, and said applying a third drive force with a control circuit including at least two inverters and at least two AND gates.

42. The method of claim 36, further including controlling said applying a first drive force, said applying a second drive force, and said applying a third drive force with a control circuit including at least two inverters and at least two NAND gates.

43. The method of claim 38, wherein said applying a first drive force further comprises decoupling said first current source from said gate terminal of said power MOSFET after a first duration.

44. The method of claim 43, wherein said applying a second drive force further comprises decoupling said second current source from said gate terminal of said power MOSFET after a second duration that is greater than said first duration.

45. The method of claim 44, wherein said applying a third drive force further comprises turning off said MOSFET coupled between said gate terminal of said power MOSFET and one terminal of said power source after a third duration that is less than said second duration.

46. The method of claim 36, wherein said first level is equal to said first threshold voltage of said power MOSFET.

47. The method of claim 36, wherein said second level is equal to twice said first threshold voltage of said power MOSFET.

* * * * *